(12) United States Patent
Di Liello et al.

(10) Patent No.: US 6,247,951 B1
(45) Date of Patent: Jun. 19, 2001

(54) FLEXIBLE CIRCUIT CONNECTOR

(75) Inventors: Paul Di Liello, Nagoya (JP); David Glen Siegfried, Vienna, OH (US); Robert W. Rimko, Transfer, PA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/306,974

(22) Filed: May 7, 1999

Related U.S. Application Data

(63) Continuation-in-part of application No. 09/086,905, filed on May 29, 1998, now abandoned.

(51) Int. Cl.[7] .................................................. H01R 13/62
(52) U.S. Cl. .......................................... 439/329; 439/492
(58) Field of Search .................................. 439/329, 492, 439/495, 497, 498, 499, 493, 494, 284, 67, 77

(56) References Cited

U.S. PATENT DOCUMENTS

| | | | |
|---|---|---|---|
| 3,500,289 | 3/1970 | Herb | 439/67 |
| 4,169,641 | 10/1979 | Olsson | 439/493 |
| 4,477,137 | 10/1984 | Ayer | 439/590 |
| 4,583,800 | 4/1986 | Roberts et al. | 439/64 |
| 4,634,195 | 1/1987 | Shoemaker | 339/17 F |
| 4,639,063 | 1/1987 | Mueller | 439/325 |
| 4,640,562 | 2/1987 | Shoemaker | 439/77 |
| 4,647,125 | * 3/1987 | Landi et al. | 439/67 |
| 4,701,133 | * 10/1987 | Worth | 439/13 |
| 4,770,645 | 9/1988 | Antes | 439/329 |
| 4,948,374 | 8/1990 | Carter | 439/67 |
| 4,948,378 | 8/1990 | Hoshino | 439/271 |
| 5,049,090 | 9/1991 | Johnson | 439/493 |
| 5,051,366 | 9/1991 | Anderson et al. | 436/67 |
| 5,213,293 | 5/1993 | Imamura | 439/67 |
| 5,213,511 | 5/1993 | Sobhani | 439/67 |
| 5,224,865 | 7/1993 | Woith et al. | 439/67 |
| 5,336,095 | 8/1994 | Walburn et al. | 439/67 |
| 5,730,619 | 3/1998 | Hamlin | 439/493 |

\* cited by examiner

*Primary Examiner*—Paula Bradley
*Assistant Examiner*—Ross Gushi
(74) *Attorney, Agent, or Firm*—Richard A. Jones

(57) ABSTRACT

An electrical connector for connecting a terminal portion of a first flexible circuit to a terminal portion of a second flexible circuit has a first clamp member and a second clamp member that cooperate to clamp the terminal portions against each other. Each clamp member has a bed with a support cooperating with the support of the other clamp member for clamping the terminal portions of the flexible circuits together. Each bed has two posts and two assembly holes. Each post engages a pilot hole of each terminal portion and an assembly hole of the other bed to orient and position the terminal portions of the flexible circuits with respect to the clamp members and the clamp members with respect to each other. Each clamp member also has two latch arms and two lock nibs for engaging respective lock nibs and latch arms of the other clamp member for attaching the clamp members to each other. The clamp members are preferably identical but may come in several versions that are interchangeable.

17 Claims, 3 Drawing Sheets

FLEXIBLE CIRCUIT CONNECTOR

RELATED APPLICATIONS

This is a continuation-in-part of U.S. patent application Ser. No. 09/086,905 for a Flexible Circuit Connector filed May 29, 1998 now abandoned.

TECHNICAL FIELD

This invention relates generally to electrical connectors and more particularly to electrical connectors for connecting two flexible circuits together.

BACKGROUND OF THE INVENTION

Flexible circuits, also known as flat cable or flexible printed circuits, comprise flat flexible conductors, usually copper, that are arranged side by side on a thin, flexible sheet or film of plastic insulation such as polyethylene. The flexible conductors may also be embedded in the plastic insulator or sandwiched between two flexible sheets of plastic insulation that are bonded together.

Flexible circuits commonly have a terminal portion where the plastic insulation is removed to expose at least one surface of the flat flexible conductors so that the flat flexible conductors can be connected to other conductors electrically. These other conductors can take the form of sheet metal terminals, electrical wires or cables, the flat conductors of printed circuit boards or the flat conductors of another flexible circuit.

Flexible circuits have been used in automotive wiring particularly in connection with instrument panels. The complexity of automotive wiring increases yearly resulting in increased use of flexible circuits and the need for an electrical connector for connecting one flexible circuit to another flexible circuit that is economical to manufacture and easy to install when connecting the flexible circuits to each other.

SUMMARY OF THE INVENTION

This invention provides an electrical connector for connecting two flexible circuits that is economical to manufacture and easy to install when connecting two flexible printed circuits to each other.

A feature of the electrical connector of the invention is that the electrical connector comprises two clamp members that are installed simply by snapping the two clamp members together manually in a clamping relationship with overlapping terminal portions of two flexible printed circuits.

Another feature of the electrical connector of the invention is that the electrical connector comprises two clamp members that can be identical for economy of manufacture.

Yet another feature of the electrical connector of the invention is that the electrical connector comprises two clamp members of molded plastic construction for economy of manufacture.

Still another feature of the electrical connector of the invention is that the electrical connector can be disassembled to service and/or replace one or both flexible circuits.

These and other objects, features and advantages of the invention will become more apparent from the following description of a preferred embodiment taken in conjunction with the accompanying drawing.

DESCRIPTION OF THE PREFERRED EMBODIMENT

Figure 1:
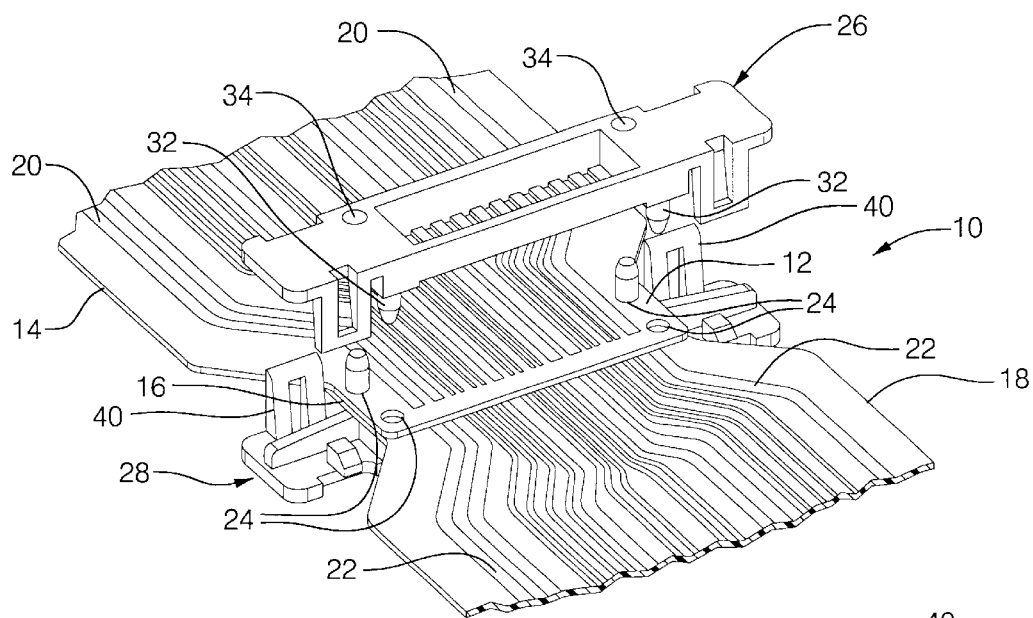
FIG. 1 is a perspective view of an electrical connector in accordance with the present invention.
Figure 2:
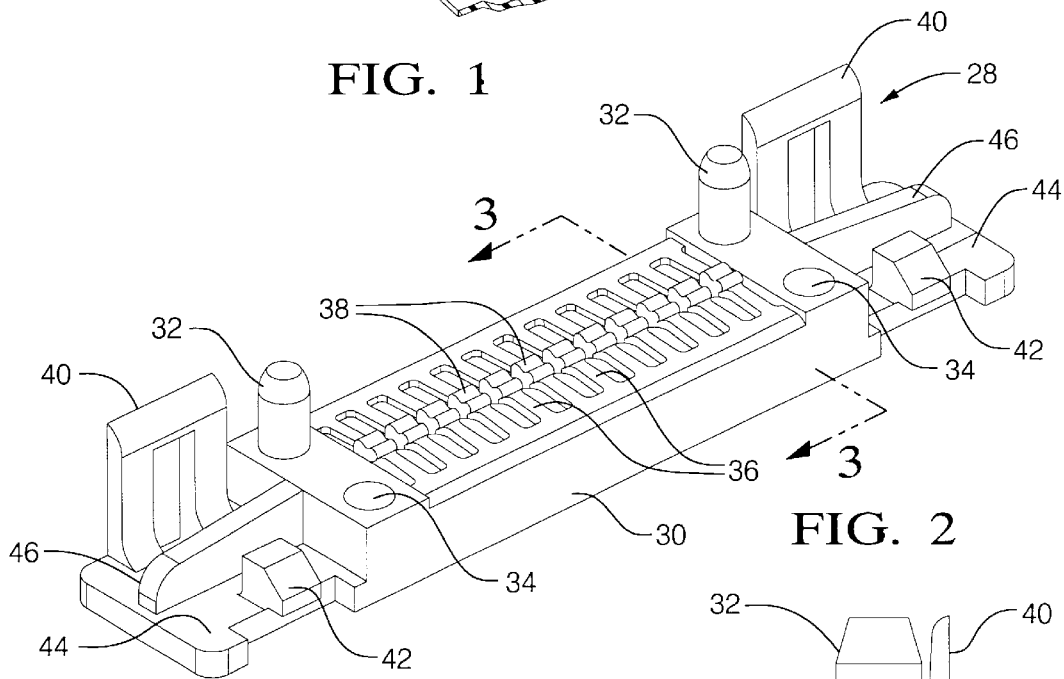
FIG. 2 is a perspective view of a component of the electrical connector of FIG. 1.
Figure 3:
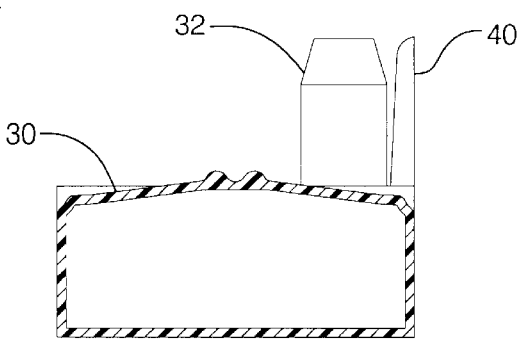
FIG. 3 is a sectional view taken substantially along line 3—3 of FIG. 2 looking in the direction of the arrows.

Referring now to FIGS. 1 to 4 of the drawing, an electrical connector 10 connects a terminal portion 12 of flexible circuit 14 to a terminal portion 16 of flexible circuit 18 mechanically and electrically.

Flexible circuits are well known in the art and comprise a plurality of flat flexible conductors, usually copper, that are arranged side by side on a thin flexible sheet of plastic insulation. The conductors can be bonded to the surface of the plastic insulation, embedded in the plastic insulation or sandwiched between two flexible sheets of plastic insulation that are bonded together. Common materials for the plastic insulation include polypropylene and Mylar which is the trademark of DuPont for their polyester films.

The terminal portions 12 and 16 of flexible circuits 14 and 18 each have insulation removed to expose contact portions of the flat conductors 20 and 22 so that the contact portions of flexible circuit 14 engage the contact portions of flexible circuit 18 when the terminal portions 12 and 16 overlap as shown in FIG. 1 and are pressed against each other by electrical connector 10.

Each of the terminal portions 12 and 16 include a plurality of pilot holes 24. The terminal portions 12 and 16 are preferably rectangular with a pilot hole 24 at each corner of the rectangle.

Figure 4:
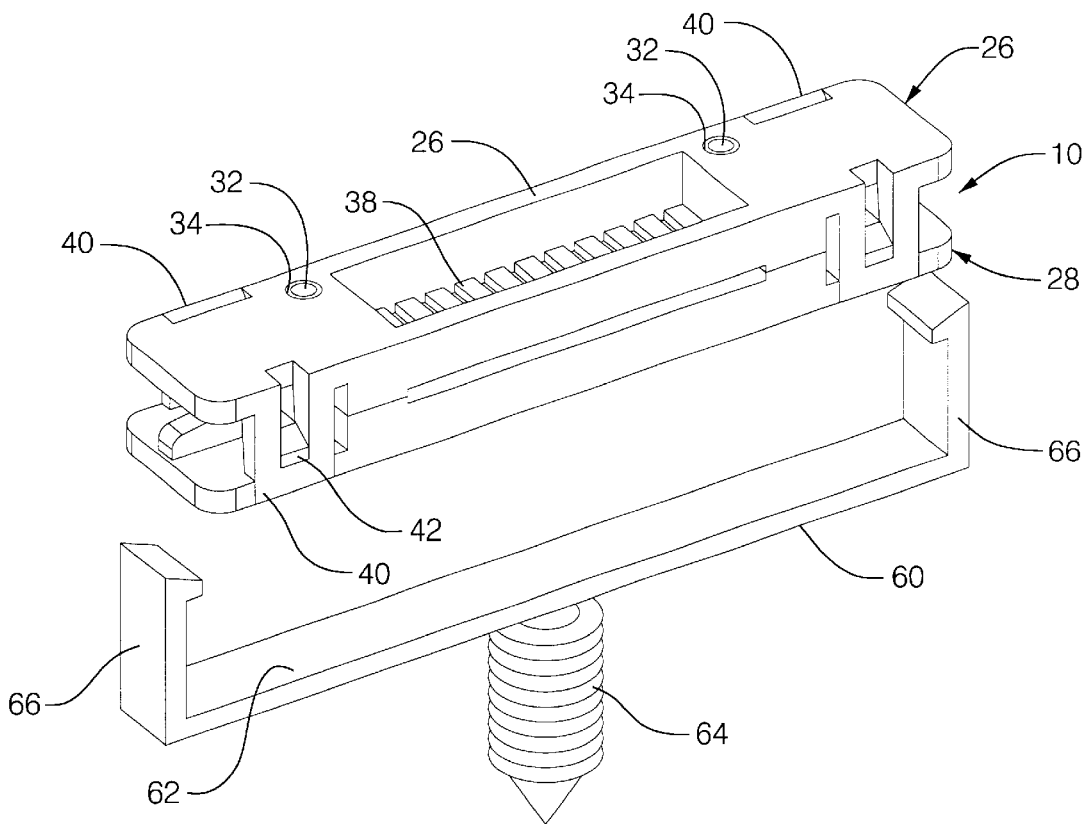
FIG. 4 is an exploded perspective view of the electrical connector of FIG. 1 and a mounting clip.

Electrical connector 10 comprises upper and lower clamp members 26 and 28. Clamp members 26 and 28 are of molded plastic constriction and are preferably identical for economy of manufacture. Moreover, the identical clamp members 26 and 28 are designed so that clamp members 26 and 28 interfit and are connected together easily when one clamp member is turned upside down and assembled to the other as best shown in FIGS. 1 and 4.

Identical clamp members 26 and 28 each comprise a bed 30 for holding terminal portions 12 or 16. Clamp members 26 and 28 are hermaphroditic in that each bed 30 includes two posts 32 and two assembly holes 34. Pilot holes 24, posts 32 and assembly holes 34 all have substantially the same diameter so that posts 32 fit into pilot holes 24 and assembly holes 34. Clamp members 26 and 28 are connected to each other with terminal portions 12 and 16 overlapping with each other and sandwiched between the respective beds 30 of the two clamp members 26 and 28 and with the posts 32 of one clamp member extending through two pilot holes of each terminal portion 12 and 16 and into two assembly holes 34 of the other clamp member. Thus posts 32 establish the proper orientation and location of the terminal portions 12 and 16 as well as the clamp members 26 and 28 with respect to each other for accurate and efficient establishment of electrical contact between the respective contact portions of flexible circuits 26 and 28.

Each bed 30 has a support 31 for engaging the insulated side of terminal portion 12 or 16. Each support 31 has a plurality of longitudinal slots 33 that provides a plurality of resilient beams 36 that are spaced from each other in the lateral direction. Each beam 36 has a protruding nubbin 38 that is bifurcated laterally to provide two ribs. These ribs press the exposed contact portions of flexible circuits 14 and 18 into intimate contact with each other to establish a good electrical connection.

Identical clamp members 26 and 28 each have two latch arms 40 and two lock nibs 42. The latch arms 40 of clamp member 26 engage the lock nibs 42 of clamp member 28 and vice-versa to hold clamp members 26 and 28 together. Latch arms 40 are preferably located adjacent the respective opposite lateral ends of bed 30 on the same longitudinal side with posts 32 so that the latch arms 40 and posts 32 protect each other during shipment and handling. This arrangement locates the lock nibs 42 on the opposite longitudinal side with assembly holes 24 that do not require any protection.

The latch arms 40 and lock nibs 42 are also preferably supported on depressed lateral end portions 44 of clamp members 26 and 28. This increases the length and consequently the resilience of the latch arms 40 that must snap over the lock nibs 42 during assembly. The depressed lateral end portions have a median lateral rib 46 that strengthens the end portions 44 and provides an anti-snag guard for the lock nibs 42.

In operation, the terminal portion 16 of the flexible circuit 18 is oriented and fixed onto the clamp member 28 by placing two outboard pilot holes 24 onto posts 32. The terminal portion 12 of the flexible circuit 14 is similarly aligned and overlapped onto the terminal portion 16 of flexible circuit 18 and onto clamp member 28 beneath it by placing the two inboard pilot holes 24 onto the posts 32 of clamp member 28 as shown in FIG. 1. The clamp members 26 and 28 are then snap assembled manually simply by turning clamp member 26 upside down and inserting the posts 32 of clamp member 26 into the assembly holes 34 of clamp member 28 with the posts 32 of clamp member 26 passing through the aligned pilot holes 24 of terminal portions 12 and 16 in the process. Clamp members 26 and 28 are then pushed together until latch arms 40 of each clamp member snap over the lock nibs 42 of the other clamp member. The resulting contact force of nubbins 38 of each clamp member causes each resilient beam 36 to deflect inwardly, thereby forcing the contact portions of the respective flexible circuits 14 and 18 into intimate contact with each other to connect the flexible circuits 14 and 18 electrically in an efficient manner.

As best illustrated in FIG. 4, the electrical connector 10 may be secured to an object (not shown), such as a vehicle body, using a mounting clip 60. In this example the mounting clip 60 includes a U-shaped portion 62 and an anchor 64. The electrical connector 10 is retained by the arms 66 of the U-shaped portion 62 that flex and latch over the lateral ends of the electrical connector 10. Anchor 64 is illustrated as a threaded screw extending from the base of the U-shaped portion 62, that can be screwed into the object. However, any suitable anchor can be used.

Figure 5:
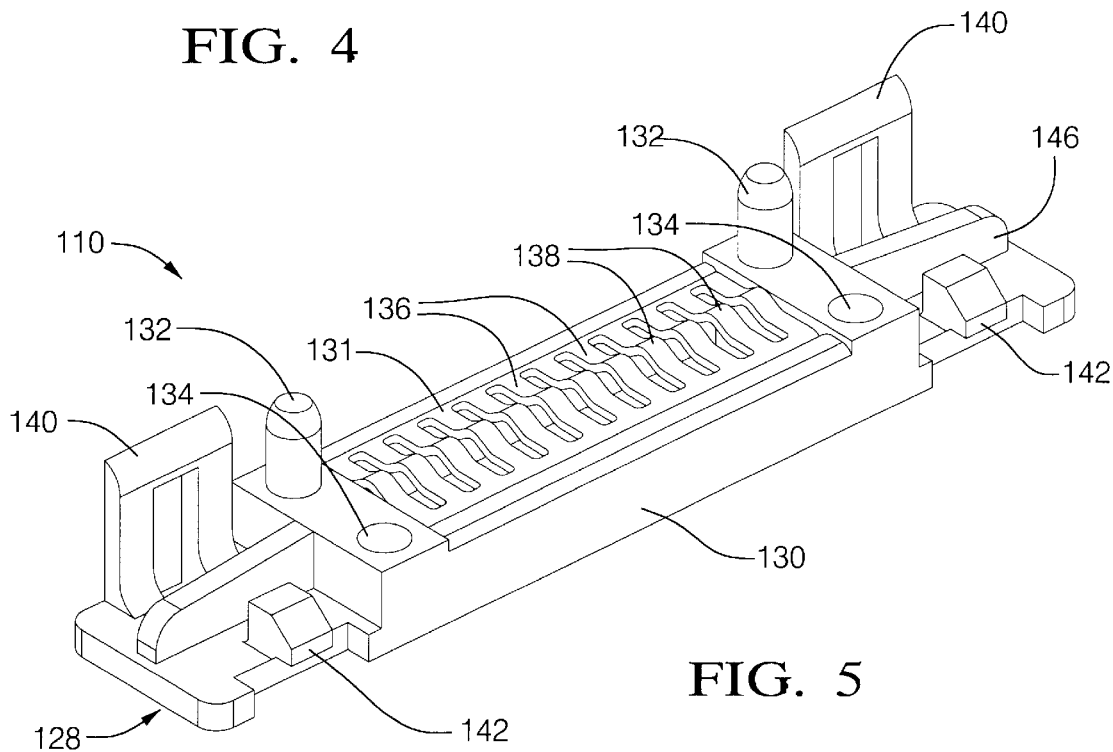
FIG. 5 is a perspective view of a component of another electrical connector in accordance with the invention.
Figure 6:
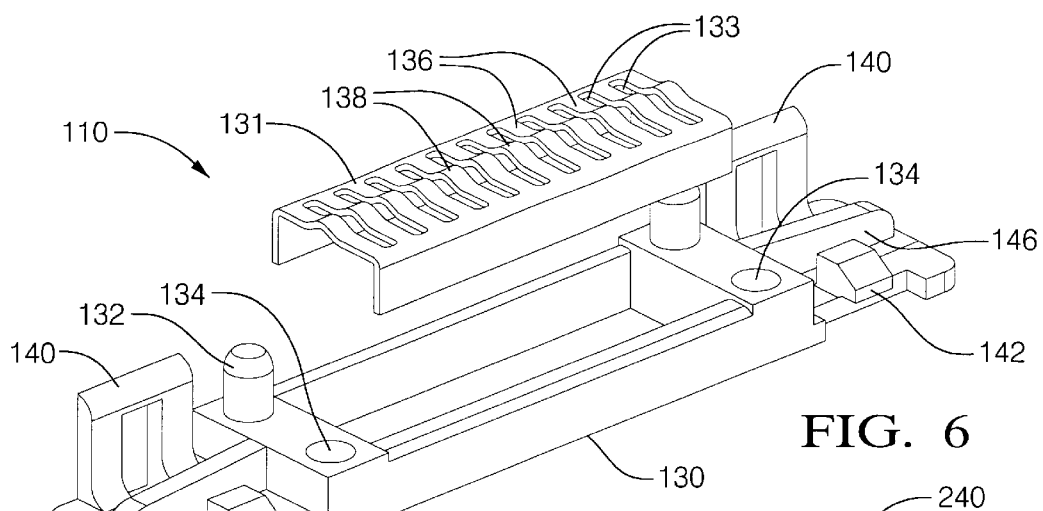
FIG. 6 is an exploded perspective view of the component shown in FIG. 5.

Referring to FIGS. 5 and 6, another embodiment according to the present invention is illustrated as electrical connector 110. Electrical connector 110 comprises two identical clamp members one of which is illustrated and identified as 128 in FIGS. 5 and 6. Clamp member 128 is similar to clamp members 26 and 28 and like parts of clamp member 128 have like reference numerals increased by one hundred. In this embodiment, clamp member 128 includes a separable support insert 131 in the form of a U-shaped spring insert, that is preferably made of metal. Each support insert 131 is retained in the bed 130 of clamp member 128 by an interference fit. Each support insert 131 includes a plurality of radially extending slots 133 that form a plurality of simple resilient beams 136 that are spaced from each other in the lateral direction and that flex independently when a contact force is applied. Each beam 136 has a protruding contact nubbin 138 that presses against the insulated side of one of the flexible circuits when it is positioned on the contact nubbins 138 and the clamp member 128 is assembled to an identical clamp member (not shown) in the same way that clamp members 26 and 28 are snapped together. Each insert 131 has a plurality of contact nubbins 138 protruding from its surface. In this example, there are twelve (12) contact nubbins 138. The contact nubbins 138 are aligned longitudinally along the separable support 131.

Figure 7:
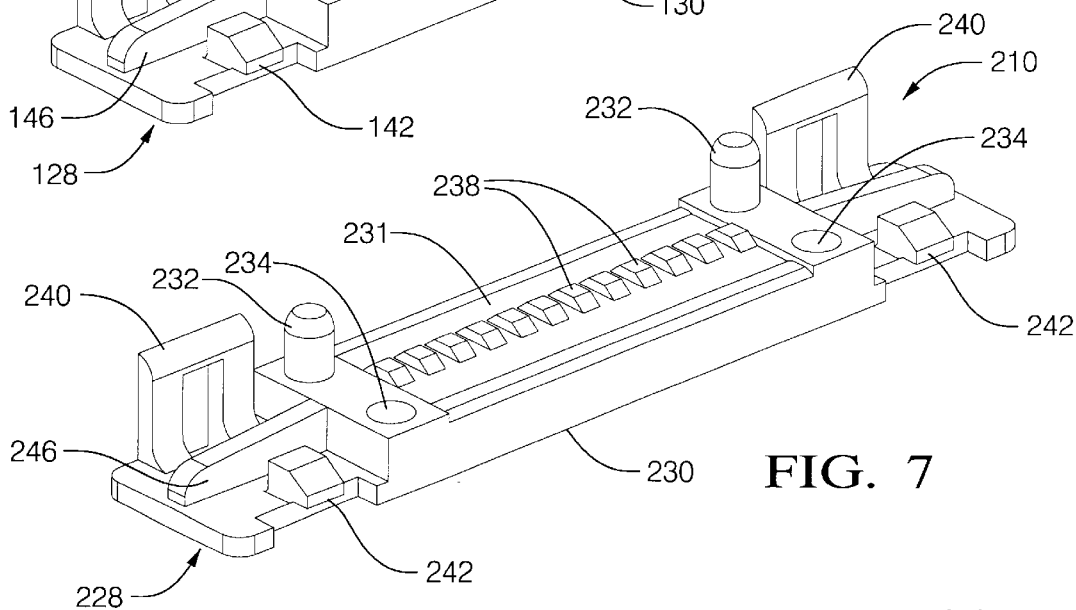
FIG. 7 is a perspective view of a component of still another electrical connector in accordance with the invention.
Figure 8:
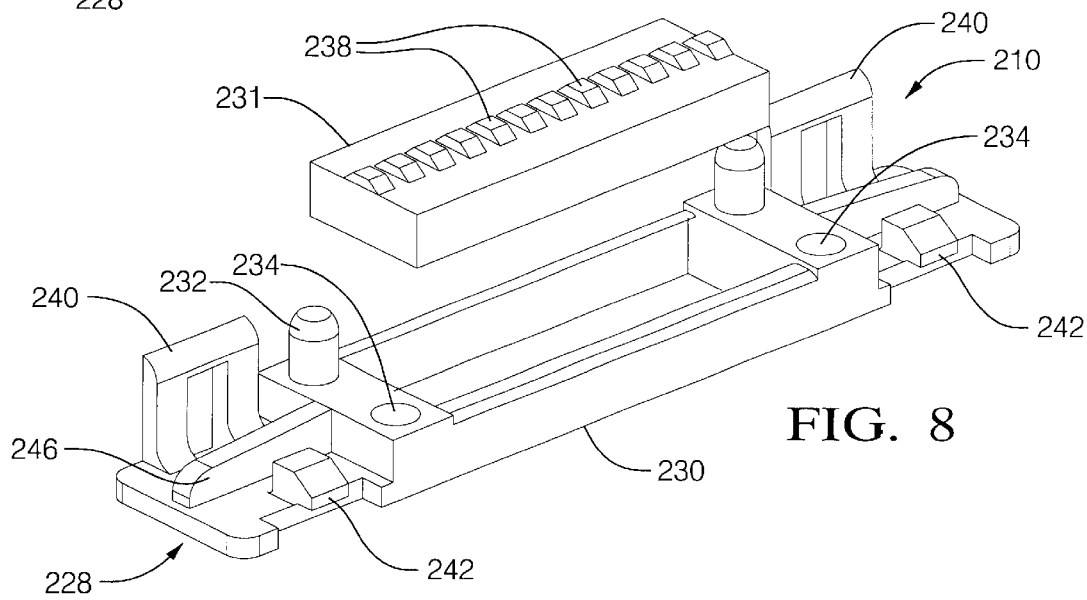
FIG. 8 is an exploded perspective view of the component shown FIG. 7.

Referring to FIGS. 7 and 8, still another embodiment according to the present invention, is illustrated as electrical connector 210 that comprises two identical clamp members, one of which is identified as clamp member 228. Clamp member 228 is similar to clamp members 26 and 28 and like parts have like reference numerals increased by two hundred. In this embodiment, the support 231 is a solid insert that is separable from bed 230. Support 231 is generally rectangular, and preferably made of a silicone or other rubber-like material. The solid insert support 231 is retained in bed 230 of clamp member 228 by an interference fit. The solid insert support 231 has a plurality of contact nubbins 238 protruding from its surface. The contact nubbins 238 are aligned and spaced from each other in the lateral direction. Preferably, the rubber-like material used for the solid insert support 231 is flexible enough to allow the nubbins 238 to flex independently when a contact force is applied, so that the nubbins 238 act as individual compression springs when clamp member 228 is interconnected with an identical clamp member.

It is preferable to use two identical clamp members for economic reasons. This presupposes that only one embodiment is tooled. However, if more than one embodiment is tooled, clamp members 26, 28, 128 and 228 are interchangeable and may be mixed and matched with each other.

Many modifications and variations of the present invention in light of the above teachings may be made. It is, therefore, to be understood that, within the scope of the appended claims, the invention may be practiced otherwise than as specifically described.

What is claimed is:

1. An electrical connector for connecting a terminal portion of a first flexible circuit to a terminal portion of a second flexible circuit comprising:

a first clamp member and a second clamp member that cooperate to clamp the terminal portions against each other, each clamp member having a bed with a resilient support cooperating with the resilient support of the other clamp member for clamping the terminal portions of the flexible circuits together;

each bed having at least one post and at least one assembly hole for engaging a respective assembly hole and post of the other bed to orient and position the terminal portions of the flexible circuits with respect to the clamp members and the clamp members with respect to each other; and each clamp member having at least one latch arm and at least one lock nib for engaging a respective lock nib and latch arm of the other clamp member for attaching the clamp members to each other so as to clamp the terminal portions of the flexible circuits together, wherein the clamp members are identical.

2. The electrical connector as defined in claim 1 wherein at least one of the supports has a plurality of protruding nubbins for contacting an insulated side of one of the terminal portions.

3. The electrical connector as defined in claim 2 wherein the at least one of the supports is a removable solid elastomeric insert.

4. The electrical connector as defined in claim 1 wherein each bed is rectangular and each bed has two posts and two assembly holes arranged at respective corners of the rectangle and each terminal portion has four pilot holes, each of which receives one of the posts so that the terminal portion overlap between the clamp members.

5. The electrical connector as defined in claim 4 wherein each bed has the posts laterally spaced from each other adjacent a longitudinal side of the clamp member and two assembly holes adjacent an opposite longitudinal side of the clamp member.

6. The electrical connector as defined in claim 1 wherein each support has a plurality of protruding nubbins for contacting an insulated side of the respective terminal portions.

7. An electrical connector for connecting a terminal portion of a first flexible circuit to a terminal portion of a second flexible circuit comprising:

a first clamp member and a second clamp member, each clamp member having a bed with a support cooperating with the support of the other clamp member for clamping the terminal portions of the flexible circuits together, each bed having at least one post and at least one assembly hole for engaging a respective assembly hole and post of the other bed to orient and position the terminal portions of the flexible circuits with respect to the clamp members and the clamp members with respect to each other;

each clamp member having at least one latch arm and at least one lock nib for engaging a respective lock nib and latch arm of the other clamp member for attaching the clamp members to each other so as to clamp the terminal portions of the flexible circuits together, at least one of the supports having a plurality of protruding nubbins for contacting an insulated side of one of the terminal portions, the at least one of the supports having a plurality of longitudinal slots that provide a plurality of resilient beams that are spaced from each other in a lateral direction and the plurality of protruding dimples being located on the plurality of resilient beams respectively.

8. The electrical connector as defined in claim 7 wherein the at least one of the supports is an integral part of the respective bed.

9. The electrical connector as defined in claim 7 wherein the at least one of the supports is a removable spring insert.

10. An electrical connector for connecting a terminal portion of a first flexible circuit to a terminal portion of a second flexible circuit comprising:

a first clamp member and a second clamp member, each clamp member having a rectangular bed, the rectangular bed located between the longitudinal sides, the rectangular bed having a support, the support cooperating with the support of the other clamp member for clamping the terminal portions of the flexible circuits together;

each rectangular bed having two posts and two assembly holes arranged at respective corners of the rectangular bed, the two posts laterally spaced from each other adjacent a longitudinal side of the clamp member, the two assembly holes adjacent an opposite longitudinal side of the clamp member, the posts and assembly holes for engaging respective posts and assembly holes of the other bed to orient and position the terminal portions of the flexible circuits with respect to the clamp members and the clamp members with respect to each other; and each clamp member having two latch arms located on the one longitudinal side of the clamp member outboard of the posts and two lock nibs located on the opposite longitudinal side of the clamp member outboard of the holes, the latch arms and the lock nibs being located on depressed lateral end portions of the clamp members, each latch arm of one clamp member engaged to the respective lock nib of the other clamp member in assembly, the depressed lateral end portions each having a lateral rib extended rigidly upward located between the latch arm and the lock nib.

11. The electrical connector as defined in claim 10 wherein the clamp members are identical.

12. The electrical connector as defined in claim 10 wherein at least one of the supports has a plurality of protruding nubbins for contacting an insulated side of one of the terminal portions.

13. The electrical connector as defined in claim 12 wherein the at least one of the supports is a removable solid elastomeric insert.

14. The electrical connector as defined in claim 12 wherein the at least one of the supports has a plurality of longitudinal slots that provide a plurality of resilient beams that are spaced from each other in a lateral direction and the plurality of protruding nubbins are located on the plurality of resilient beams respectively.

15. The electrical connector as defined in claim 14 wherein the at least one of the supports is an integral part of the respective bed.

16. The electrical connector as defined in claim 14 wherein the at least one of the supports is a removable spring insert.

17. An electrical connector for connecting a terminal portion of a first flexible circuit to a terminal portion of a second flexible circuit comprising:

a first clamp member and a second clamp member that cooperate to clamp the terminal portions together, each clamp member having a bed with a support, each support having a plurality of longitudinal slots, a plurality of resilient beams, and a plurality of protruding nubbins, each longitudinal slot interposed between the resilient beams, the resilient beams spaced from each other in a lateral direction, the plurality of protruding nubbins located on the plurality of resilient beams respectively, the plurality of nubbins for contacting an insulated side of the respective terminal portions, the nubbins of the first clamp member cooperating with the nubbins of the second clamp member for clamping the terminal portions of the flexible circuits against each other;

each bed having at least one post and at least one assembly hole for engaging a respective assembly hole and post of the other bed to orient and position the terminal portions of the flexible circuits with respect to the clamp members and the clamp members with respect to each other; and each clamp member having at least one latch arm and at least one lock nib for engaging a respective lock nib and latch arm of the other clamp member for attaching the clamp members to each other so as to clamp the terminal portions of the flexible circuits together, wherein the clamp members are identical.

* * * * *